(12) United States Patent
Nagai et al.

(10) Patent No.: US 10,734,259 B2
(45) Date of Patent: Aug. 4, 2020

(54) ELECTRONIC COMPONENT MOUNTING APPARATUS

(71) Applicant: SHINKAWA LTD., Tokyo (JP)

(72) Inventors: Satoru Nagai, Tokyo (JP); Shin Takayama, Tokyo (JP); Midori Kobayashi, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 16/462,536

(22) PCT Filed: Nov. 21, 2016

(86) PCT No.: PCT/JP2016/084442
§ 371 (c)(1),
(2) Date: Oct. 28, 2019

(87) PCT Pub. No.: WO2018/092306
PCT Pub. Date: May 24, 2018

(65) Prior Publication Data
US 2020/0058528 A1 Feb. 20, 2020

(51) Int. Cl.
*H01L 21/67* (2006.01)
*H01L 21/683* (2006.01)

(52) U.S. Cl.
CPC .. *H01L 21/67144* (2013.01); *H01L 21/67103* (2013.01); *H01L 21/6838* (2013.01)

(58) Field of Classification Search
None
See application file for complete search history.

(56) References Cited

U.S. PATENT DOCUMENTS 8,670,651 B2  3/2014  Sakuragi et al.

FOREIGN PATENT DOCUMENTS

| JP | S55121655 | 9/1980 |
| JP | H06338543 | 12/1994 |
| JP | H07161742 | 6/1995 |
| JP | 2012165313 | 8/2012 |
| JP | 2016192501 | * 11/2016 |

OTHER PUBLICATIONS

"International Search Report (Form PCT/ISA/210) of PCT/JP2016/084442," dated Dec. 27, 2016, with English translation thereof, pp. 1-3.

* cited by examiner

*Primary Examiner* — Christopher Braniff
(74) *Attorney, Agent, or Firm* — JCIPRNET

(57) ABSTRACT

A flip-chip bonding apparatus (100) is provided with: a bonding tool (10) that includes a base (11), and an island (13) that vacuum-sucks, to a surface (14) thereof, a semiconductor die (70) having protruding electrodes (72, 73) that are disposed on both the surfaces; and a heater (20) that heats the semiconductor die (70) vacuum-sucked to the island (13). The flip-chip bonding apparatus heats the semiconductor die (70), bonds the protruding electrodes (73) of the semiconductor die (70) to protruding electrodes (82) of a semiconductor die (80), and seals, using a non-conductive film (NCF) (75), a gap between the semiconductor die (70) and the semiconductor die (80). Continuous vacuum suction holes (15) are provided in the base (11), said continuously vacuum suction holes being at positions adjacent to the outer peripheral surface of the island (13).

6 Claims, 7 Drawing Sheets

ELECTRONIC COMPONENT MOUNTING APPARATUS

CROSS-REFERENCE TO RELATED APPLICATION

This application is a 371 application of the International PCT application serial no. PCT/JP2016/084442, filed on Nov. 21, 2016. The entirety of each of the above-mentioned patent applications is hereby incorporated by reference herein and made a part of this specification.

TECHNICAL FIELD

The present invention relates to a structure of an electronic component mounting apparatus that heats a semiconductor die and mounts the semiconductor die on a substrate or another semiconductor die.

BACKGROUND ART

Methods of heating a semiconductor die which has been sucked to an attachment with a vacuum using a heating tool and mounting the semiconductor die on a substrate by pressing the semiconductor die onto the substrate on which a thermosetting resin has been applied have been often used. When a thermosetting resin is heated, volatile components thereof are gasified, and the gasified volatile components condense into a liquid or solidify into a solid by cooling. Accordingly, the volatile components of the thermosetting resin which have been gasified by heating may be sucked into a vacuum flow passage from a slight gap between the heating tool and the attachment or a slight gap between the attachment and the semiconductor die and condense or solidify in a switching valve to cause an operation failure in vacuum suctioning or solidify in a gap between the heating tool and the attachment to cause a heating failure in the semiconductor die. Accordingly, a method of covering the surroundings of the heating tool and the attachment with a cover and blowing air from the cover to prevent gasified volatile components from being sucking into a slight gap between the heating tool and the attachment or a vacuum suction hole has been proposed (for example, see Patent Literature 1).

In thermocompression of a semiconductor die of placing a conductive adhesive on a glass substrate, pressing a semiconductor die which has been sucked to a thermocompression head thereon, and melting the conductive adhesive to mount the semiconductor die on the glass substrate, foreign matter such as contaminants may be attached to the thermocompression head with vapor which is generated when the conductive adhesive is heated and melted. For the purpose of prevention thereof, a method of causing a nozzle sucking vapor to protrude downward from the thermocompression head and sucking the vapor which is generated when the conductive adhesive is heated and melted has been proposed (for example, see Patent Literature 2).

In order to prevent a thermally decomposed flux (solder paste) from damaging the surface of a semiconductor die or the surface of a package in mounting the semiconductor die on a substrate by soldering, a method of disposing a suction pipe on a side surface of a collet for sucking the semiconductor die and sucking the thermally decomposed flux from the suction pipe has been proposed (for example, see Patent Literature 3).

CITATION LIST

Patent Literature

[Patent Literature 1]
Japanese Patent Application Laid-Open No. 2012-165313
[Patent Literature 2]
Japanese Patent Application Laid-Open No. H07-161742
[Patent Literature 3]
Japanese Patent Application Laid-Open No. S55-121655

SUMMARY OF INVENTION

Technical Problem

Recently, stacked mounting of stacking and bonding semiconductor dies having protruding electrodes disposed on both surfaces thereof in a plurality of stages has been often performed. In such stacked mounting, solder bumps are formed on the protruding electrodes of a semiconductor die which is bonded, a nonconductive film (NCF) is attached to the surfaces thereof, the semiconductor die is inverted, and the opposite surface thereof is sucked to a bonding tool. Thereafter, when the bumps of the semiconductor chip are pressed against electrodes of another semiconductor die using the bonding tool and the temperature of the bonding tool is increased to a melting temperature of solder (about 250° C.), the nonconductive film (NCF) decreases in viscosity to fill a gap between the semiconductor chips. Thereafter, the solder is melted and resin curing progresses. Then, when the bonding tool is raised, the temperature of the solder is decreased, the solder is solidified, and the stacked mounting of semiconductor chips is finished.

In the semiconductor die which is subjected to stacked mounting, since protruding electrodes are also formed on a surface thereof which is sucked to the bonding tool, a gap corresponding to the height of the protruding electrodes is formed between the surface of the bonding tool and the semiconductor die when the semiconductor die is sucked to the tip of the bonding tool with the vacuum. When the nonconductive film (NCF) is heated to 200° C. or higher, low-molecular-weight components such as acryl monomers are gasified. Accordingly, when the temperature of the bonding tool is raised to a melting temperature of solder (about 250° C.), the gasified components of the nonconductive film (NCF) are sucked into a vacuum suction hole in the bonding tool from the gap.

In such stacked mounting, when a semiconductor die is picked up, it is necessary to decrease the temperature of the bonding tool to, for example, about 100° C. such that the nonconductive film (NCF) does not decrease in viscosity. The pressure of the vacuum suction hole is in a vacuum state when a semiconductor die is being sucked, and vacuum suction needs to be stopped to detach the semiconductor die from the bonding tool after the semiconductor die has been bonded. Accordingly, a process of sucking the gasified components of the nonconductive film (NCF) in a gas state into a vacuum suction hole formed in the bonding tool when the bonding tool is heated to about 250° C. at the time of bonding the electrodes in a state in which a semiconductor die is sucked, allowing the sucked gasified components to stay in the vacuum suction hole when vacuum suctioning is stopped, and condensing the gasified components staying therein into a liquid when the bonding tool is cooled to about 100° C. is repeated. Accordingly, there is a problem in that the gasified components condense into a liquid, the liquid accumulates in a slight gap in the bonding tool, and the liquid may eventually leak to the surroundings of the bonding tool to damage the bonding tool or the like.

Therefore, an objective of the present invention is to prevent a bonding tool from being damaged in an electronic component mounting apparatus that bonds a semiconductor die having protruding electrodes disposed on both surfaces thereof to a substrate or another semiconductor die and seals a gap between the semiconductor die and the substrate or another semiconductor die using a resin.

Solution to Problem

According to the present invention, there is provided an electronic component mounting apparatus including: a bonding tool including a base and an island that protrudes from the base and sucks a semiconductor die having protruding electrodes disposed on both surfaces of the semiconductor die onto a surface of the island with a vacuum; and a heater that is disposed on a base side of the bonding tool and heats the semiconductor die which is sucked to the island with a vacuum, wherein the electronic component mounting apparatus heats the semiconductor die, bonds the protruding electrodes on a surface of the semiconductor die opposite to the island to a substrate or other electrodes of another semiconductor die, and seals a gap between the surface of the semiconductor die opposite to the island and a surface of the substrate or the other semiconductor die using a resin, and wherein a plurality of continuous vacuum suction holes are provided at positions adjacent to an outer peripheral surface of the island of the base.

In the electronic component mounting apparatus according to the present invention, a plurality of types of bonding tools having different total areas of the continuous vacuum suction holes may be able to be attached to the electronic component mounting apparatus in accordance with a height of the protruding electrodes on a surface of the semiconductor die on the island side.

In the electronic component mounting apparatus according to the present invention, when the height of the protruding electrodes of the surface of the semiconductor die on the island side is large, a bonding tool having the larger total area of the continuous vacuum suction holes may be able to be attached to the electronic component mounting apparatus than when the height of the protruding electrodes of the surface of the semiconductor die on the island side is small.

In the electronic component mounting apparatus according to the present invention, a diameter of each continuous vacuum suction hole may be substantially equal to a height of the island.

In the electronic component mounting apparatus according to the present invention, each continuous vacuum suction hole may be rectangular, oval, or elliptical, and a width of a short side thereof is substantially equal to a height of the island.

In the electronic component mounting apparatus according to the present invention, other continuous vacuum suction holes communicating with the continuous vacuum suction holes provided in the base may be provided in the heater, a cooling pipe that cools gas sucked from the continuous vacuum suction holes to condense or solidify the gas may be connected to the other continuous vacuum suction holes, and a recovery container that stores a liquid or a solid condensing or solidifying in the cooling pipe may be connected to the cooling pipe.

Advantageous Effects of Invention

According to the present invention, it is possible to prevent a bonding tool from being damaged in an electronic component mounting apparatus that bonds a semiconductor die having protruding electrodes disposed on both surfaces thereof to a substrate or another semiconductor die and seals a gap between the semiconductor die and the substrate or another semiconductor die using a resin.

DESCRIPTION OF EMBODIMENTS

Figure 1:
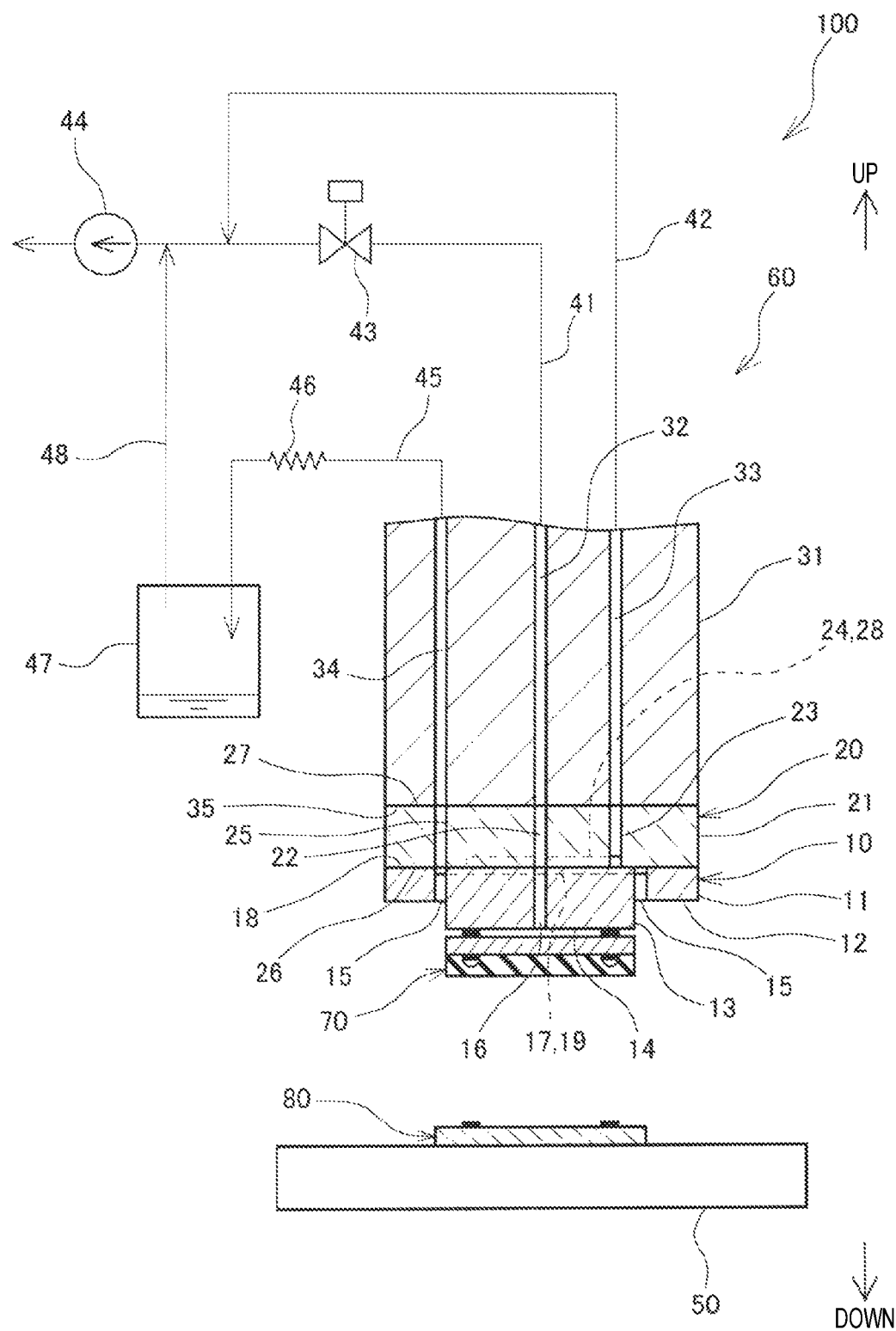
FIG. 1 is a system diagram illustrating a configuration of a flip-chip bonding apparatus according to an embodiment of the present invention.

Hereinafter, a flip-chip bonding apparatus 100 which is an embodiment of an electronic component mounting apparatus according to the present invention will be described with reference to the accompanying drawings. As illustrated in FIG. 1, the flip-chip bonding apparatus 100 according to this embodiment includes a bonding stage 50 that sucks and fixes a semiconductor die 80 or a substrate to a top surface thereof and a bonding head 60 that is driven in an approaching and separating direction (a vertical direction in FIG. 1) or in a horizontal direction relative to the bonding stage 50 using a drive device which is not illustrated. The bonding head 60 includes a body 31 that is connected to the drive device which is not illustrated, a heater 20 that is attached to a bottom surface 35 of the body 31, and a bonding tool 10 that is sucked and fixed to a bottom surface 26 of the heater 20 with a vacuum. A semiconductor die 70 is sucked to a surface 14 of the bonding tool 10 with a vacuum.

Figure 2A:
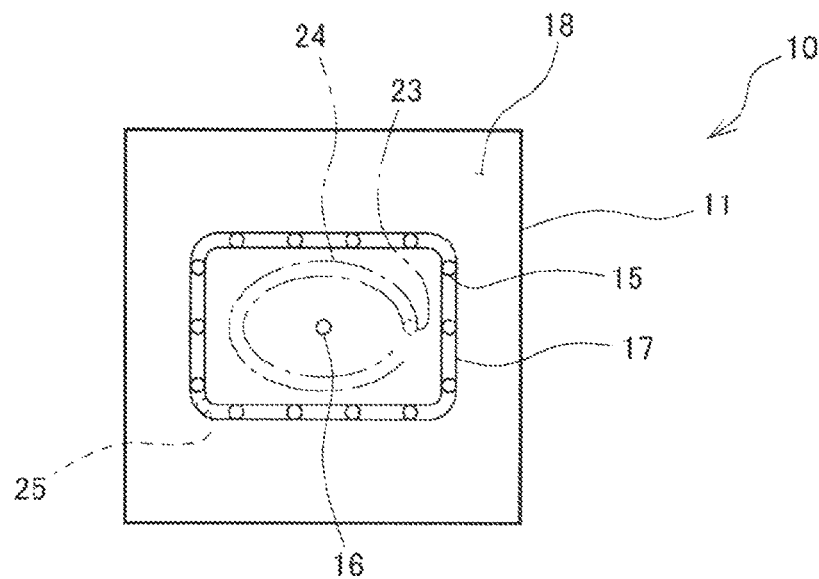
FIG. 2A is a top view of a bonding tool which is used for the flip-chip bonding apparatus according to the embodiment of the present invention.
Figure 2B:
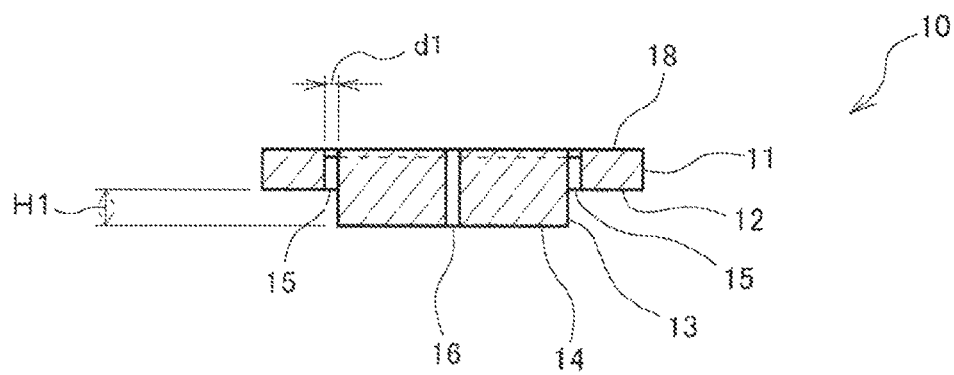
FIG. 2B is a sectional view of the bonding tool which is used for the flip-chip bonding apparatus according to the embodiment of the present invention.
Figure 2C:
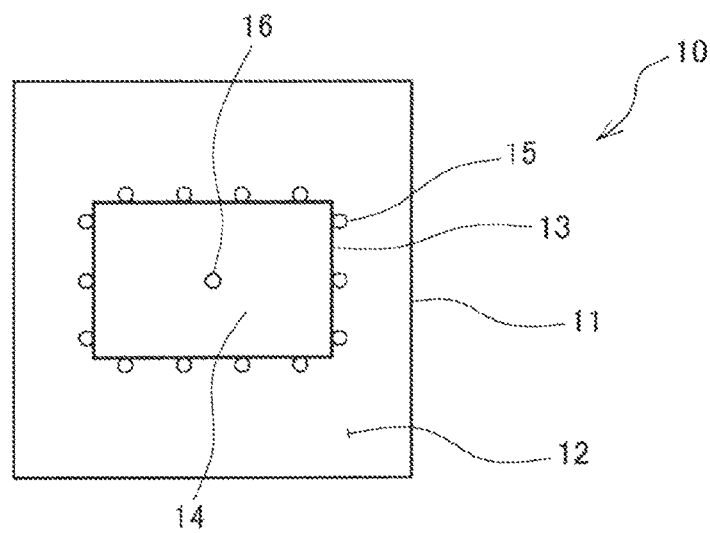
FIG. 2C is a bottom view of the bonding tool which is used for the flip-chip bonding apparatus according to the embodiment of the present invention.

As illustrated in FIG. 2B, the bonding tool 10 includes a base 11 having a rectangular plate shape and an island 13 that protrudes from a bottom surface 12 of the base 11 in a rectangular pedestal shape and sucks the semiconductor die 70 illustrated in FIG. 1 to the surface 14 with a vacuum. A vacuum hole 16 for sucking the semiconductor die 70 with a vacuum is provided at the center of the bonding tool 10 to penetrate the base 11 and the island 13. As illustrated in FIG. 2C, a plurality of continuous vacuum suction holes 15 are provided at positions on the base 11 adjacent to an outer peripheral surface of the island 13. In this embodiment, a diameter dl of each continuous vacuum suction hole 15 is set to be equal to a protruding height H1 of the island 13 from the bottom surface 12 of the base 11. As illustrated in FIG. 2A, the continuous vacuum suction holes 15 communicate with an annular groove 17 which is provided on the top surface 18 of the base 11 in contact with the bottom surface 26 of the heater body 21 of the heater 20. The number of continuous vacuum suction holes 15 is set such that a ratio of a total area of a plurality of continuous vacuum suction holes 15 provided on a short side of the island 13 to a total area of a plurality of continuous vacuum suction holes 15 provided on a long side of the island 13 is substantially the same as a length ratio of the short side to the long side of the island 13. Accordingly, air can be sucked from the surroundings of the island 13 with good balance.

Figure 3A:
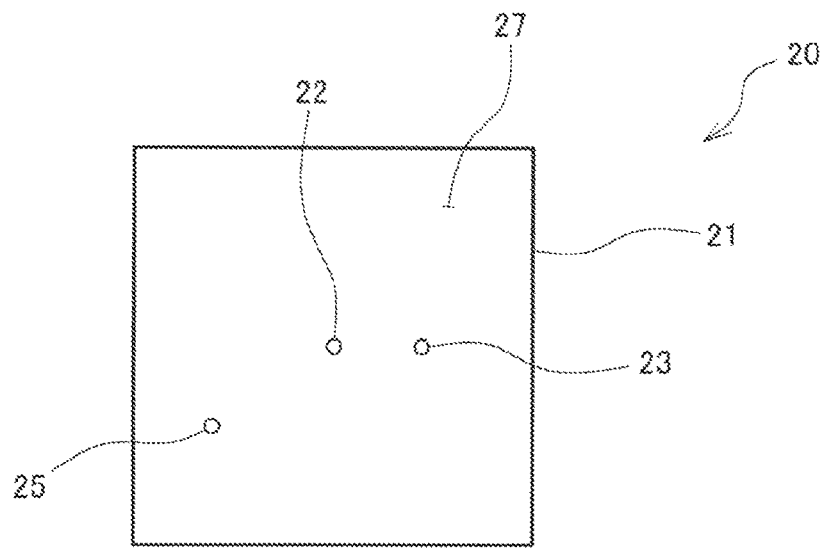
FIG. 3A is a top view of a heater which is used for the flip-chip bonding apparatus according to the embodiment of the present invention.
Figure 3B:
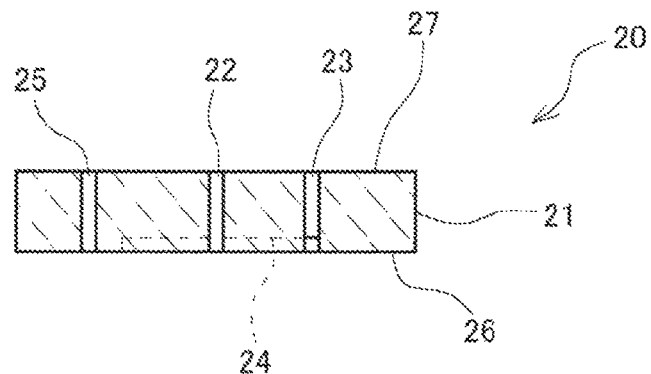
FIG. 3B is a sectional view of the heater which is used for the flip-chip bonding apparatus according to the embodiment of the present invention.
Figure 3C:
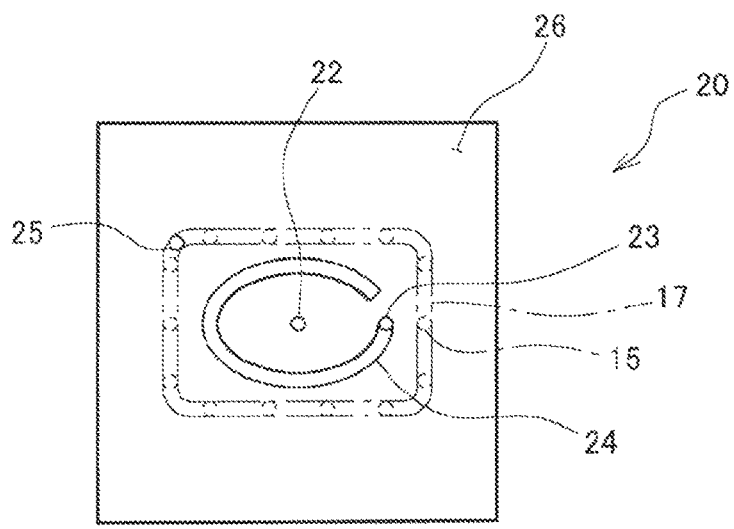
FIG. 3C is a bottom view of the heater which is used for the flip-chip bonding apparatus according to the embodiment of the present invention.

The heater 20 has, for example, a rectangular plate shape in which a heating resistor element formed of platinum, tungsten, or the like is embedded in a ceramic such as aluminum nitride and has a size substantially equal to that of the bonding tool 10. As illustrated in FIG. 3A to FIG. 3C, a vacuum hole 22 that communicates with the vacuum hole 16 of the bonding tool 10 is provided at the center thereof. As illustrated in FIG. 3C, a C-shaped groove 24 is provided in a region corresponding to the inside of the annular groove 17 of the top surface 18 of the bonding tool 10, and a vacuum hole 23 penetrating the heater 20 in a thickness direction thereof is provided at one end of the groove 24. As illustrated in FIG. 3C, a vacuum hole 25 is provided at a position corresponding to a corner of the annular groove 17 of the top surface 18 of the bonding tool 10. The vacuum holes 22, 23, and 25 are formed to the top surface 27 as illustrated in FIG. 3A.

As illustrated in FIG. 1, vacuum holes 32, 33, and 34 are provided at positions on the body 31 corresponding to the vacuum holes 22, 23, and 25 of the heater 20, and the vacuum holes 22, 23, and 25 of the heater 20 communicate with the vacuum holes 32, 33, and 34, respectively.

As illustrated in FIG. 1, when the top surface 18 of the bonding tool 10 is aligned with the bottom surface 26 of the heater 20, the C-shaped groove 24 provided on the bottom surface 26 of the heater 20 illustrated in FIG. 3C is closed by a plane on an inner peripheral side of the groove 17 provided on the top surface 18 of the bonding tool 10 to form a channel 28 communicating with the vacuum hole 23 as illustrated in FIG. 1 and FIG. 2A. The groove 17 provided on the top surface 18 of the bonding tool 10 illustrated in FIG. 2A is closed by a plane on an outer peripheral side of the C-shaped groove 24 of the bottom surface 26 of the heater 20 to form a channel 19 that communicates with the vacuum hole 25 of the heater 20 and communicates with the plurality of continuous vacuum suction holes 15 of the bonding tool 10 which are open to the base 11 as illustrated in FIG. 1 and FIG. 3C. The vacuum hole 16 at the center of the bonding tool 10 communicates with the vacuum hole 25 of the heater 20.

The vacuum hole 33 of the body 31 is connected to a vacuum pump 44 via a pipe 42. The vacuum hole 32 is connected to the vacuum pump 44 via a pipe 41 in which an electromagnetic valve 43 is disposed in the middle thereof. The vacuum hole 34 is connected to a cooling pipe 46 via a pipe 45, and the cooling pipe 46 is connected to an air-tight recovery container 47. The recovery container 47 and the vacuum pump 44 are connected to each other via a pipe 48.

With the above-mentioned configuration is employed, when the vacuum pump 44 is driven, the channel 28 constituted by the vacuum hole 33 connected to the pipe 42, the vacuum hole 23 and the groove 24 of the heater 20 communicating with the vacuum hole 33, and the top surface 18 of the bonding tool 10 is brought into a vacuum state, and the bonding tool 10 is sucked to the bottom surface 26 of the heater 20 with a vacuum. When the electromagnetic valve 43 is opened, the vacuum hole 32 of the body 31 connected to the pipe 41 and the vacuum hole 22 of the heater 20 and the vacuum hole 16 of the bonding tool 10 communicating with the vacuum hole 32 are brought into a vacuum state, and the semiconductor die 70 can be sucked to the surface 14 of the bonding tool 10 with a vacuum. When the vacuum pump 44 is driven, the channel 19 constituted by the recovery container 47 connected to the vacuum pump 44 via the pipe 48, the cooling pipe 46 connected to the recovery container 47, the vacuum hole 34 of the body 31 connected to the cooling pipe 46 via the pipe 45, the vacuum hole 25 of the heater 20 communicating with the vacuum hole 34, the groove 17 provided on the top surface 18 of the bonding tool 10, and the bottom surface 26 of the heater 20 is brought into a vacuum state, and air around the island 13 is sucked from the plurality of continuous vacuum suction holes 15.

Figure 4:
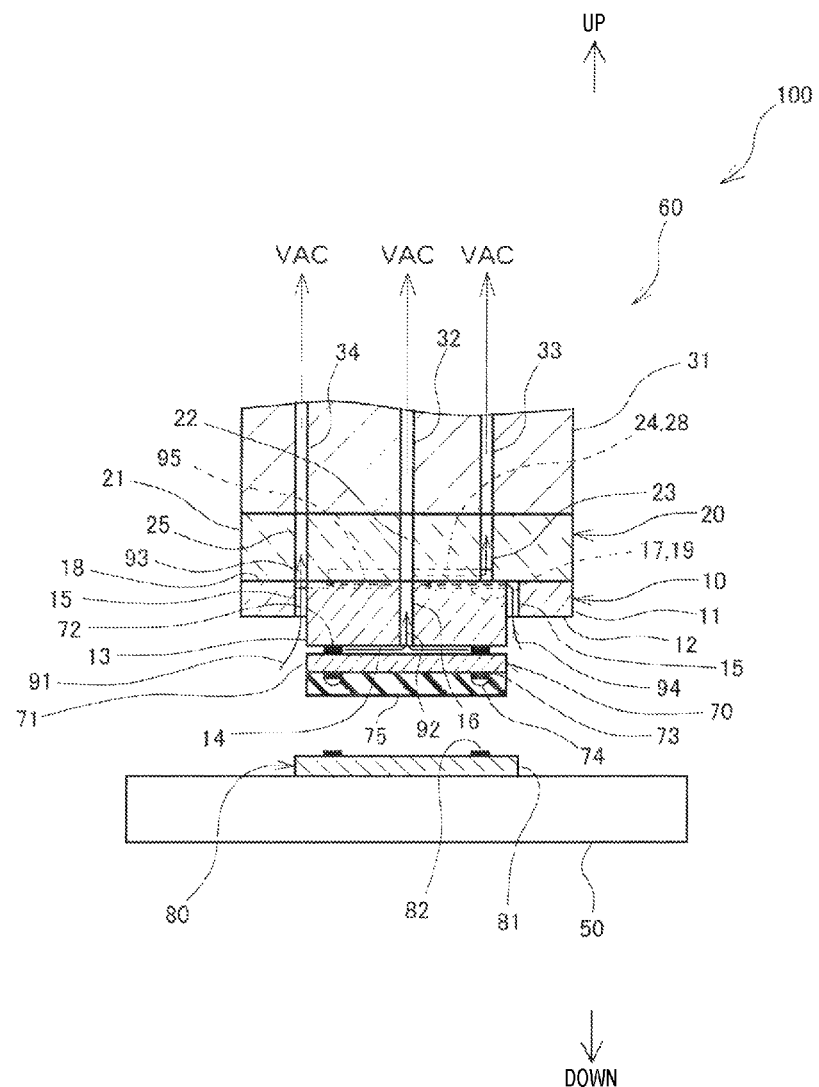
FIG. 4 is a diagram illustrating a state in which a semiconductor die of a second stage is sucked to the bonding tool in a process of stacking and mounting a semiconductor die having electrodes disposed on both surfaces thereof using the flip-chip bonding apparatus according to the embodiment of the present invention.
Figure 5:
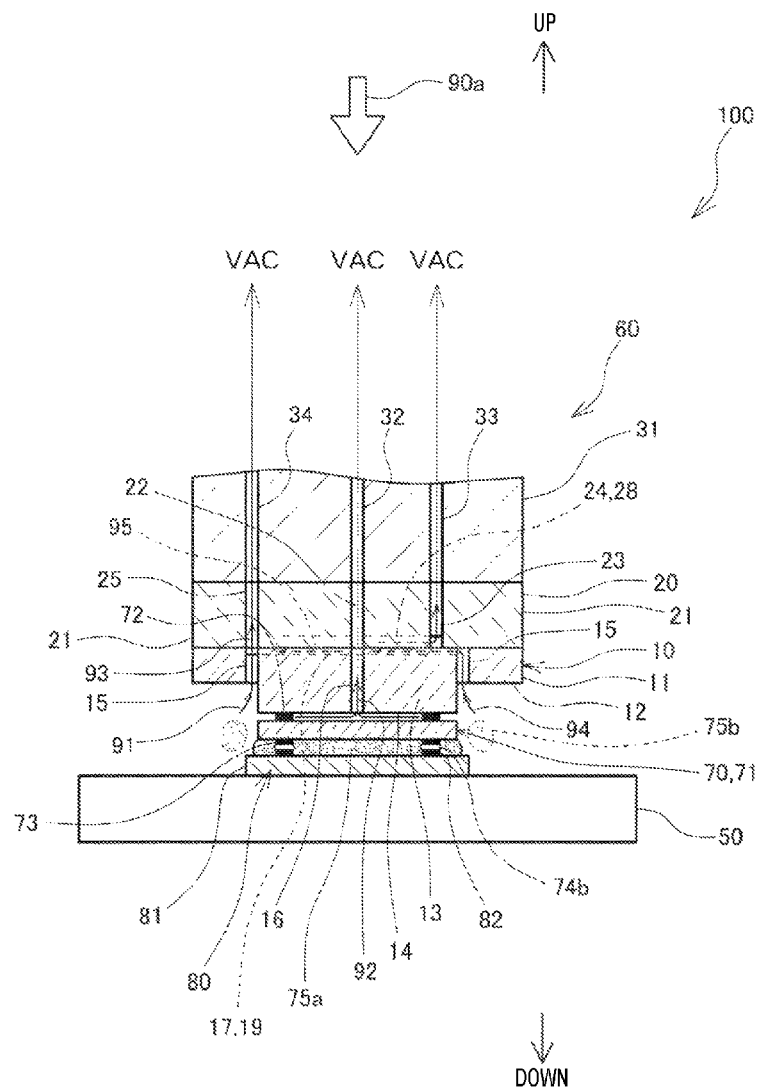
FIG. 5 is a diagram illustrating a state in which the bonding tool is moved down to press electrodes of the semiconductor die of the second stage onto electrodes of a semiconductor die of a first stage and the semiconductor die of the second stage is being heated using the heater after the process illustrated in FIG. 4.
Figure 6:
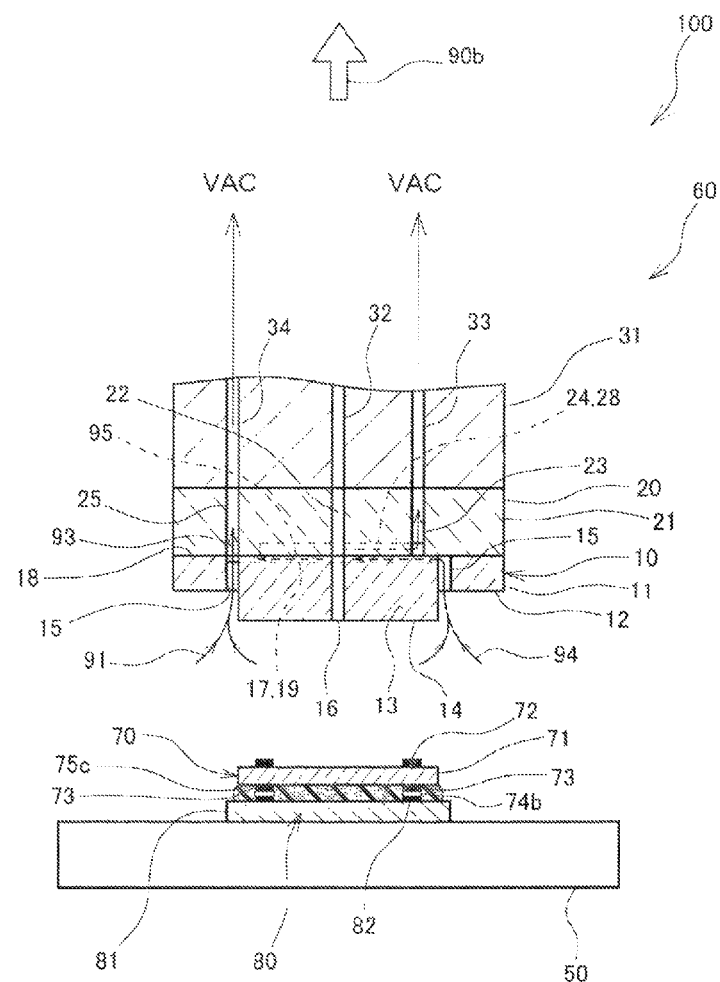
FIG. 6 is a diagram illustrating a state in which the bonding tool is moved up after the process illustrated in FIG. 5.

A process of mounting a semiconductor die 70 of a second stage in which protruding electrodes 72 are formed on one surface of a die body 71, protruding electrodes 73 are formed on the other surface, bumps 74 are formed at the tips of the protruding electrodes 73 out of solder or the like, and a nonconductive film (NCF) 75 is attached to the other surface on which the protruding electrodes 73 are provided on a semiconductor die 80 of a first stage in which protruding electrodes 82 are formed on the top surface of a die body 81 using the flip-chip bonding apparatus 100 will be described below with reference to FIG. 4 to FIG. 6. The protruding electrodes 72 and 73 may be formed of, for example, copper.

First, as illustrated in FIG. 4, the semiconductor die 80 of the first stage is sucked to the top surface of the bonding stage 50 with a vacuum. The vacuum pump 44 illustrated in FIG. 1 is driven to form a vacuum in the vacuum hole 33 of the body 31, the vacuum hole 23 of the heater 20, and the channel 19 of the heater 20 and the top surface 18 of the bonding tool 10 is sucked to the bottom surface 26 of the heater 20 with a vacuum. Then, the bonding head 60 is moved over a semiconductor die 70 which is placed on an inversion and transfer device for the semiconductor die 70 which is not illustrated such that the protruding electrodes 72 face the top side. Then, the electromagnetic valve 43 is opened to form a vacuum in the vacuum hole 32 of the body 31, the vacuum hole 25 of the heater 20, and the vacuum hole 16 of the bonding tool 10 and to suck the surface of the semiconductor die 70 of the second stage on the protruding electrodes 72 side to the surface 14 of the island 13 of the bonding tool 10 with a vacuum. Thereafter, by moving the bonding head 60 such that the position of the semiconductor die 70 of the second stage matches the position of the semiconductor die 80 of the first stage sucked onto the bonding stage 50 with a vacuum, the state illustrated in FIG. 4 is obtained. In this state, the temperature of the bonding tool 10 is about 100° C. and the bumps 74 are not melted yet. The nonconductive film (NCF) 75 has not reached a low viscosity state yet.

As illustrated in FIG. 4, a gap corresponding to the height of the protruding electrodes 72 is formed between the surface 14 of the bonding tool 10 and the die body 71 of the semiconductor die 70, and air around the semiconductor die 70 is likely to enter the vacuum hole 16 via the gap as indicated by an arrow 92 in FIG. 4 even in a state in which the semiconductor die 70 is sucked to the surface 14 of the bonding tool 10 with a vacuum. In contrast, air around the island 13 or around the semiconductor die 70 is sucked into the channel 19 from the plurality of continuous vacuum suction holes 15 disposed around the island 13 as indicated by arrows 91 and 94 in FIG. 4. In this way, since air around the island 13 and the semiconductor die 70 is sucked from the plurality of continuous vacuum suction holes 15, little air around the side surfaces of the semiconductor die 70 is sucked into the vacuum hole 16 which is disposed at the center of the bonding tool 10.

Then, as illustrated in FIG. 5, the bonding head 60 is moved down by a drive device which is not illustrated as indicated by an outlined arrow 90*a* in FIG. 5, the bumps 74 of the semiconductor die 70 of the second stage sucked to the surface 14 of the bonding tool 10 with a vacuum are pressed onto the protruding electrodes 82 of the semiconductor die 80 of the first stage sucked to the bonding stage 50 with a vacuum, and the semiconductor die 70 of the second stage is heated to about 250° C. using the heater 20 to melt the bumps 74. Then, the nonconductive film (NCF) 75 attached to the protruding electrodes 73 side of the semiconductor die 70 of the second stage decreases in viscosity and fills a gap between the die body 81 of the semiconductor die 80 of the first stage and the die body 71 of the semiconductor die 70 of the second stage. Thereafter, the protruding electrodes 82 of the semiconductor die 80 of the first stage and the protruding electrodes 73 of the semiconductor die 70 of the second stage are metallically bonded by the melted bumps 74, and the resin filled into the gap from the die body 71 of the semiconductor die 70 is thermally cured to be a thermosetting resin 75*a*.

At this time, as illustrated in FIG. 5, gasified components of the nonconductive film (NCF) 75 stays as a gas 75*b* around the semiconductor die 70. The accumulated gas 75*b* flows into the channel 19 from the plurality of continuous vacuum suction holes 15 disposed around the island 13 as indicated by arrows 91 and 94, passes through the channel 19 as indicated by an arrow 95, and flows into the cooling pipe 46 via the vacuum hole 25 of the heater 20, the vacuum hole 34 of the body 31, and the pipe 45 as indicated by an arrow 93. The gas 75*b* is cooled from the temperature of about 250° C. to room temperature in the cooling pipe 46. Then, the gas 75*b* condenses into a liquid or solidifies into a solid and collects on the bottom of the recovery container 47. In contrast, an air component which does not condense and does not solidify flows into the recovery container 47 from the cooling pipe 46, is sucked to the vacuum pump 44 via the pipe 48, and is discharged to the outside. Since air around the island 13 and the semiconductor die 70 is sucked from the plurality of continuous vacuum suction holes 15 as described above, little air around the side surfaces of the semiconductor die 70 is sucked into the vacuum hole 16 which is disposed at the center of the bonding tool 10. Accordingly, the gas 75*b* generated around the semiconductor die 70 does not also enter the vacuum hole 16, the vacuum hole 22 of the heater 20, and the vacuum hole 32 of the body 31.

Then, by closing the electromagnetic valve 43 illustrated in FIG. 1 to stop the evacuation of the vacuum hole 16 and then moving the bonding head 60 up as indicated by an outlined arrow 90*b* using a drive device which is not illustrated as illustrated in FIG. 6, the semiconductor die 80 of the first stage and the semiconductor die 70 of the second stage bonded to the semiconductor die 80 of the first stage remain on the bonding stage 50. Then, when the temperature decreases, the melted bumps 74 are solidified to be bonding metal 74*b*, and the thermosetting resin 75*a* is cured to be a filling resin 75*c* that fills the gap between the top surface of the die body 81 of the semiconductor die 80 of the first stage and the bottom surface of the die body 71 of the semiconductor die 70 of the second stage.

Even in the state in which the semiconductor die 70 of the second stage is mounted on the semiconductor die 80 of the first stage and the bonding head 60 is moved up as illustrated in FIG. 6, the plurality of continuous vacuum suction holes 15 continue to suck air around the island 13 of the bonding tool 10. Accordingly, after mounting of the semiconductor die 70 of the second stage has been completed, the gas 75*b* remaining around the island 13 is continuously sucked and cooled in the cooling pipe 46, and condensed or solidified components are recovered into the recovery container 47. Since the plurality of continuous vacuum suction holes 15 continues to suck air, the gas 75*b* does not stay in the vacuum hole 34 of the body 31, the vacuum hole 25 of the heater 20, and the channel 19 of the bonding tool 10. Accordingly, when the temperatures of the bonding tool 10 and the heater 20 are decreased for a next mounting process, the gas 75*b* staying in the vacuum hole 34 of the body 31, the vacuum hole 25 of the heater 20, and the channel 19 of the bonding tool 10 condenses into a liquid and the inner and outer surfaces of the bonding tool 10 are not damaged. Since the gas 75*b* little enters the vacuum hole 16 of the bonding tool 10, the vacuum hole 22 of the heater 20, and the vacuum hole 32 of the body 31 as described above, it is possible to prevent the gas 75*b* from condensing into a liquid in the vacuum holes 16, 22, and 32 and damaging the inner and outer surfaces of the bonding tool 10 when the temperatures of the bonding tool 10 and the heater 20 are lowered for a next mounting process.

Another bonding tool 110 which is used for the flip-chip bonding apparatus 100 according to an embodiment of the present invention will be described below with reference to FIG. 7A to FIG. 7C. The same elements as described above with reference to FIG. 1 to FIG. 6 will be referred to by the same reference signs and description thereof will not be repeated.

As described above with reference to FIG. 4, a gap corresponding to the height of the protruding electrodes 72 is formed between the surface of the die body 71 of the semiconductor die 70 of the second stage and the surface 14 of the bonding tool 10 and air around the semiconductor die 70 is likely to be sucked from the gap, but air around the semiconductor die 70 is prevented from being sucked into the vacuum hole 16 of the bonding tool 10 by sucking the air around the semiconductor die 70 using the continuous vacuum suction holes 15 disposed around the island 13. In contrast, as the height of the protruding electrodes 72 increases, the size of the gap between the die body 71 of the semiconductor die 70 and the surface 14 of the bonding tool 10 increases and a force for sucking air around the semiconductor die 70 also increases. Therefore, when the height of the protruding electrodes 72 increases, it is necessary to increase an amount of air sucked from the surroundings of the island 13 and to prevent air around the semiconductor die 70 from being sucked into the vacuum hole 16 of the bonding tool 10 by increasing an opening area of the continuous vacuum suction holes 15 with the increase of the height of the protruding electrodes 72.

Figure 7A:
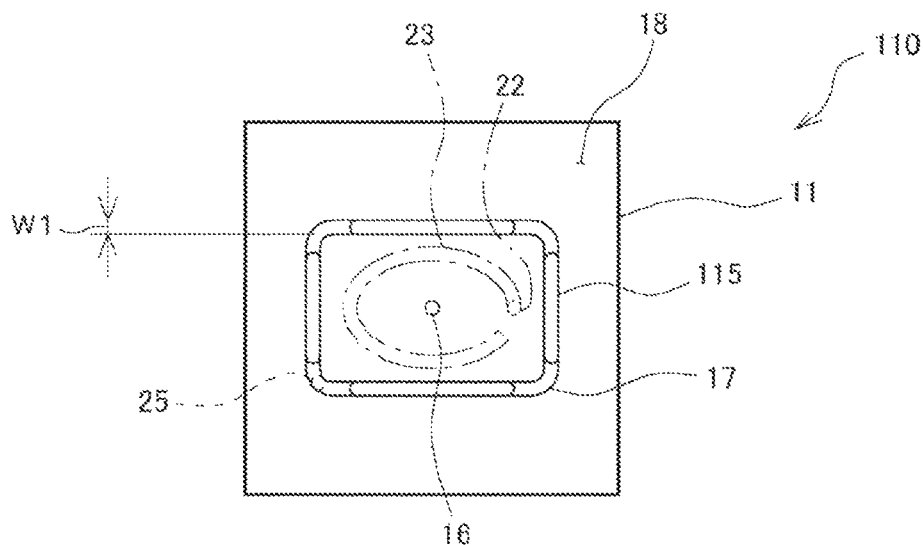
FIG. 7A is a top view of another bonding tool which is used for the flip-chip bonding apparatus according to the embodiment of the present invention.
Figure 7B:
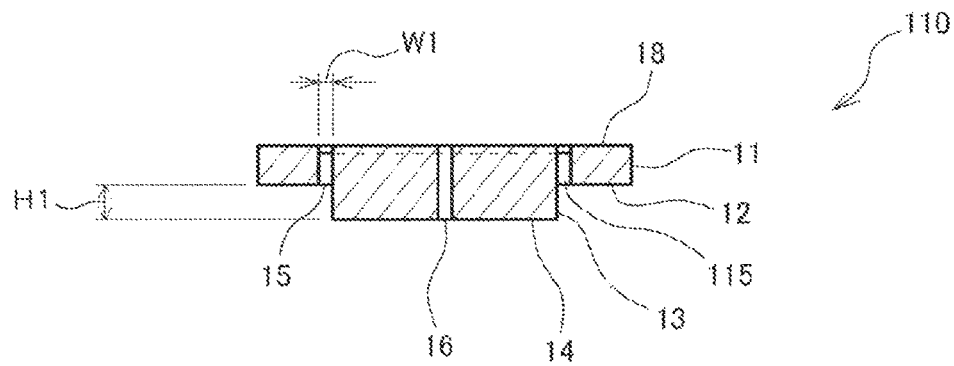
FIG. 7B is a sectional view of another bonding tool which is used for the flip-chip bonding apparatus according to the embodiment of the present invention.
Figure 7C:
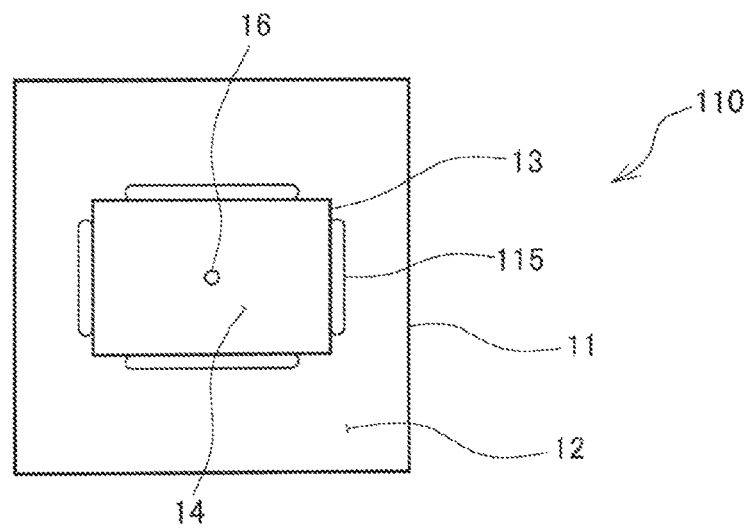
FIG. 7C is a bottom view of another bonding tool which is used for the flip-chip bonding apparatus according to the embodiment of the present invention.

Therefore, in the bonding tool 110 illustrated in FIG. 7A to FIG. 7C, a plurality of continuous vacuum suction holes 115 having an elliptical shape are disposed in the base 11 around the island 13, the total area of the continuous vacuum suction holes 115 is set to be larger than the total area of the continuous vacuum suction holes 15 of the bonding tool 10 described above with reference to FIG. 2A to FIG. 2C to increase an amount of air which is sucked from the surroundings of the island 13, and air around the semiconductor die 70 is prevented from being sucked into the vacuum hole 16 of the bonding tool 10 even when the semiconductor die 70 in which a height of the protruding electrodes 72 is great is sucked to the surface 14 with a vacuum. Each continuous vacuum suction hole 115 of the bonding tool 110 in this embodiment has an elliptical shape in which a short side width W1 has the same length as the protruding height H1 of the island 13 from the bottom surface 12 of the base 11. Similarly to the bonding tool 10 described above with reference to FIG. 2A to FIG. 2C, the number of continuous vacuum suction holes 15 is set such that a ratio of the total area of a plurality of continuous vacuum suction holes 15 provided on the short side of the island 13 to the total area of a plurality of continuous vacuum suction holes 15 provided on the long side of the island 13 is substantially the same as a length ratio of the short side to the long side of the island 13, thereby sucking air from the surroundings of the island 13 with a good balance.

The external dimensions of the bonding tool 110 and the size of the island 13 in this embodiment are the same as the external dimensions of the bonding tool 10 and the size of the island 13 which have described above with reference to FIG. 2A to FIG. 2C, and the shape of the groove 17 which is formed on the top surface 18 is also the same. Accordingly, the bonding tool 10 described above with reference to FIG. 2A to FIG. 2C can be used when a semiconductor die 70 in which a height of the protruding electrodes 72 is small is mounted using the flip-chip bonding apparatus 100 according to this embodiment, and the bonding tool 110 which has been described above with reference to FIG. 7A to FIG. 7C and in which the total area of the continuous vacuum suction holes 15 is larger than that of the bonding tool 10 described above with reference to FIG. 2A to FIG. 2C can be used when a semiconductor die 70 in which a height of the protruding electrodes 72 is small is mounted.

The shape of each continuous vacuum suction hole 115 is elliptical in this embodiment, but the shape of each continuous vacuum suction hole 115 is not limited thereto and may be, for example, rectangular or oval. When such shapes are employed, the short side width W1 may be set to be equal to the protruding height H1 of the island 13 from the bottom surface 12 of the base 11.

As described above, with the flip-chip bonding apparatus 100 according to this embodiment, it is possible to prevent the bonding tool 10 from being damaged when the semiconductor die 70 of the second stage having protruding electrodes 72 and 73 disposed on both surfaces thereof is bonded to the semiconductor die 80 of the first stage and a gap between the semiconductor die 70 of the second stage and the semiconductor die 80 of the first stage is sealed with the nonconductive film (NCF) 75.

In the above description, the nonconductive film (NCF) 75 is used to seal the gap between the semiconductor die 70 of the second stage and the semiconductor die 80 of the first stage, but the present invention is not limited thereto and can be applied to a case in which another type of sealing resin is employed.

The invention claimed is:

1. An electronic component mounting apparatus, comprising:
    a bonding tool including a base and an island that protrudes from the base and sucks a semiconductor die having protruding electrodes disposed on both surfaces of the semiconductor die onto a surface of the island with a vacuum; and
    a heater that is disposed on a base side of the bonding tool and heats the semiconductor die that is sucked to the island with a vacuum,
    wherein the electronic component mounting apparatus heats the semiconductor die, bonds the protruding electrodes of the surface of the semiconductor die opposite to the island to a substrate or other electrodes of another semiconductor die, and seals a gap between the surface of the semiconductor die opposite to the island and a surface of the substrate or the another semiconductor die using a resin, and
    wherein a plurality of continuous vacuum suction holes are provided at positions adjacent to an outer peripheral surface of the island of the base.

2. The electronic component mounting apparatus according to claim 1, wherein a plurality of types of bonding tools having different total areas of the continuous vacuum suction holes are able to be attached to the electronic component mounting apparatus in accordance with a height of the protruding electrodes on the surface of the semiconductor die on the island side.

3. The electronic component mounting apparatus according to claim 2, wherein, when the height of the protruding electrodes of the surface of the semiconductor die on the island side is large, a bonding tool having a larger total area of the continuous vacuum suction holes is able to be attached to the electronic component mounting apparatus than when the height of the protruding electrodes of the surface of the semiconductor die on the island side is small.

4. The electronic component mounting apparatus according to claim 1, wherein a diameter of each continuous vacuum suction hole is substantially equal to a height of the island.

5. The electronic component mounting apparatus according to claim 1, wherein each continuous vacuum suction hole is rectangular, oval, or elliptical, and a width of a short side of each continuous vacuum suction hole is substantially equal to a height of the island.

6. The electronic component mounting apparatus according to claim 1, wherein other continuous vacuum suction holes communicating with the continuous vacuum suction holes provided in the base are provided in the heater, a cooling pipe that cools a gas sucked from the continuous vacuum suction holes to condense or solidify the gas is connected to the other continuous vacuum suction holes, and a recovery container that stores a liquid or a solid condensing or solidifying in the cooling pipe is connected to the cooling pipe.

* * * * *